United States Patent
Huang

[11] Patent Number: 6,061,760
[45] Date of Patent: May 9, 2000

[54] CONTROLLER CIRCUIT APPARATUS FOR CD-ROM DRIVES

[75] Inventor: Wei-Hung Huang, Miaoli Hsien, Taiwan

[73] Assignee: United Microelectronics Corp., Taiwan

[21] Appl. No.: 08/927,048

[22] Filed: Sep. 10, 1997

[30] Foreign Application Priority Data

Jun. 28, 1997 [TW] Taiwan ................................ 86109100

[51] Int. Cl.[7] ............................. G06F 12/16; G06F 11/08
[52] U.S. Cl. ......................... 711/112; 711/105; 714/756; 714/6; 714/42; 714/769; 714/784
[58] Field of Search ................................. 711/112, 105; 714/6, 42, 54, 756, 769, 784

[56] References Cited

U.S. PATENT DOCUMENTS

| | | | |
|---|---|---|---|
| 4,680,764 | 7/1987 | Suzuki et al. | 714/758 |
| 4,866,717 | 9/1989 | Murai et al. | 714/764 |
| 5,453,996 | 9/1995 | Nakamura | 714/756 |
| 5,612,933 | 3/1997 | Iso et al. | 369/32 |
| 5,627,843 | 5/1997 | Deng et al. | 714/785 |

FOREIGN PATENT DOCUMENTS

| | | |
|---|---|---|
| 0567144 A3 | 10/1993 | European Pat. Off. . |
| 0569 716 A2 | 11/1993 | European Pat. Off. . |
| 0766246 A1 | 4/1997 | European Pat. Off. . |
| 9312060 | 2/1997 | Japan . |
| 2314450A | 12/1997 | United Kingdom . |

Primary Examiner—Reginald G. Bragdon
Attorney, Agent, or Firm—Rabin & Champagne, P.C.

[57] ABSTRACT

A controller circuitry for CD-ROM drive used for the storage of digital data, capable of reading data store on the CD-ROM disc and decoding to transfer the decoded data into the host computer system via an interface bus. Under the ISO 9660 standard, the controller circuitry includes a CIRC processor and an RSPC/EDC processor combined with a bus interface controller, each of which is capable of accessing a working memory device tied together. The combined circuitry configuration allows reduced access frequency in the working memory device, and there is no need to use internal high-speed SRAM. The entire controller circuitry may be fabricated as one single IC device to reduce cost while performance is improved.

22 Claims, 6 Drawing Sheets

|       | 0    | 1    | 2    |      |      |      | 41   | 42   |       |
|-------|------|------|------|------|------|------|------|------|-------|
| 0     | 0000 | 0001 | 0002 | .... | .... | .... | 0041 | 0042 | header |
| 1     | 0043 | 0044 | 0045 | .... | .... | .... | 0084 | 0085 | + |
| 2     | 0086 | 0087 | 0088 | .... | .... |      | 0127 | 0128 | user data |
| 3     | 0129 | 0130 | 0131 | .... |      |      |      | 0171 | + |
| 4     | 0172 | 0173 | .... |      | Q    |      |      | 0214 | part of |
|       |      |      |      |      |      |      |      |      | auxillary data |
| 22    | 0946 | 0947 | 0948 | .... | .... | .... | 0987 | 0988 |   |
| 23    | 0989 | 0990 | 0991 | .... | .... | .... | 1030 | 1031 |   |
| 24    | 1032 | 1033 | 1034 | .... | .... | 1072 | 1073 | 1074 | P-PARITY |
| 25    | 1075 | 1076 | 1077 | .... | .... | 1115 | 1116 | 1117 |   |
| 26    | 1118 | 1119 | 1120 | .... | 1143 |      |      |      | Q-PARITY |
| 27    | 1144 | 1145 | 1146 | .... | 1169 |      |      |      |   |

0  1  2  ....  25
P Subcode Of RS Code

|    | 0    | 1    | 2    |      | 40   | 41   | 42   | $Q_0$ | $Q_1$ |
|----|------|------|------|------|------|------|------|-------|-------|
| 0  | 0000 | 0044 | 0088 | .... | 0642 | 0686 | 0730 | 1118  | 1144  |
| 1  | 0043 | 0087 | 0131 | .... | 0685 | 0729 | 0773 | 1119  | 1145  |
| 2  | 0086 | 0130 | 0147 | .... | 0728 | 0772 | 0816 | 1120  | 1146  |
| 3  | 0129 | 0137 | 0217 | .... | 0771 | 0815 | 0859 | 1121  | 1147  |
| 4  | 0172 | 0216 | 0260 | .... | 0814 | 0858 | 0902 | 1122  | 1148  |
| 22 | 0946 | 0990 | 1034 | .... | 0470 | 0514 | 0558 | 1140  | 1166  |
| 23 | 0989 | 1033 | 1077 | .... | 0513 | 0557 | 0601 | 1141  | 1167  |
| 24 | 1032 | 1076 | 0002 | .... | 0556 | 0600 | 0644 | 1142  | 1168  |
| 25 | 1079 | 0001 | 0045 | .... | 0599 | 0643 | 0687 | 1143  | 1169  |

Q Subcode Of RS Code

FIG. 3

CONTROLLER CIRCUIT APPARATUS FOR CD-ROM DRIVES

BACKGROUND OF THE INVENTION

1. Field of the Invention

This invention relates in general to the control circuitry for CD-ROM drives, and in particular to the main controller circuitry for CD-ROM drives employing DRAM to provide working memory space for implementing signal decoding operations. More particularly, the invention relates to the main controller circuitry for CD-ROM drives with reduced access frequency in the DRAM working memory for improved overall system performance that can be implemented as a single-chip IC for reduced cost.

2. Technical Background

Laser disk drive is a category of digital storage devices widely employed in computer systems, in particular, microprocessor-based personal computers, home computers and office computer systems. In the description of this specification, these laser-based digital storage devices are generally referred to as optical disk drives, or simply as drives, as is customary in the field.

The Philips/Sony CD (Compact Disc) player is categorized as a laser technology-based optical disk drive. The CD itself has evolved from its originally intended use as a storage media for musical performances into several variants for the digital storage of information in various formats. Large amounts of digital information can be recorded on the surface of discs with 12-cm diameter. Different applications have been developed based on different formats of these CD variants. For example, in addition to the original music CD player, CD drives known as the CD-ROM drives have become widely used in the personal computer industry. Modularized designs of the CD-ROM drive can be installed in the expansion bays of typical personal computer systems such as the IBM-compatibles and serve the purpose of mass data storage at low cost.

The CD-ROM disc media used widely in the personal computer industry is one that complies with the ISO-9660 standard capable of holding more than 650 MB of information. In addition to the retrieval of data contained in the CD-ROM discs, current CD-ROM drives are also capable of playing music CDs, as well as multimedia VCDs. CD-ROM drives have virtually become the standard subsystem for personal computers.

Due to the wide acceptance of CD-ROM drives in personal computer systems, severe competition has built up in the CD-ROM drive manufacturing business. The direct result of this business competition is the rapid reduction in prices as well as rapid increase in performances. For the purpose of storage of files and/or high-resolution image/video information such as the lately established DVD (Digital Video Disc), the advancements in microprocessor technology has also urged increased demand for ever larger amounts and faster speeds of information storage and retrieval. For example, while a music CD player operates at its standard spindle speed of more than 100 to about 300 rpm, CD-ROM drives have evolved through 2x (double the spindle speed), 4x, 6x, 8x, and eventually up to 10 and even faster speeds. For the purpose of data retrieval, this increased spindle speed effectively improves the drive data transfer rate.

The digital electronic control circuitry used in the conventional CD-ROM drives usually includes an IC chip-set of two separate chips. One of the two being the read controller IC, and the other the signal decoder IC. The read controller IC includes an internal SRAM with a memory space of about 2 K bytes that is used as the data manipulation space for the de-interleaving operation. The signal decoder, on the other hand, controls an external DRAM device for implementing memory caching during operation.

Since the two IC chips are physically separate, therefore, the internal SRAM in the read controller IC is indispensable. If the two are fabricated into one single IC, and the DRAM memory device is used to replace the internal SRAM of the read controller IC, the access frequency to the DRAM would inevitably be increased to an impractical level. This is because DRAM is inherently much slower than SRAM in operating speed, which is a fact leading to the formation of a bottleneck in such a single-chip design.

In order to describe the invention, configuration of the digital electronic controlling circuitry of a conventional CD-ROM is briefly examined below. FIG. 1 is a block diagram showing the circuit configuration of the digital control electronics of a conventional CD-ROM drive. As is shown in the block diagram, the circuitry includes a read access controller 120, a signal decoder 130, an RF (radio frequency) amplifier 110 and a DRAM 140. All these circuit elements are organized and connected in a wiring network. Also note that a laser pick-up head 103 as well as a disk spindle motor 102 are also shown in the drawing and are included in the drive. These are opto- and electro-mechanical components of the drive mechanism controlled by the read access controller 120.

In the prior-art technique, the circuit elements of FIG. 1 can each be implemented as separate IC chips. For example, before being assembled into a controller electronic circuitry, the DRAM 140 can be an independent memory IC chip, the RF amplifier 110 an independent RF IC, and the read access controller 120 and the signal decoder 130 may also be physically independent from each other.

In the case of the circuitry configuration of FIG. 1, operation of the conventional CD-ROM drive concerning a host computer system such as a personal computer accessing the CD-ROM is described as follows. The spindle motor 102 spins the CD-ROM disc 101, and the laser pick-up head 103 retrieves data recorded in the form of small pits formed into the surface of the disc 101. Data pick up by the head 103 is then relayed to the RF amplifier 110 via connection 4. After amplification, portions of the data are then sent to the DSP (digital signal processor) 121 in the read access controller 120 via connection 5. DSP 121 then processes its received data, and controls the disc spindle motor 102 via the connection 7 based on its obtained data in order to maintain the spindle 102 at the proper rotational speed. On the other hand, the DSP 121 also controls the laser pick-up head 103 via the connection 6 to achieve precision adjustment over the drive mechanism in order to obtain adequate beam-focusing as well as proper head-tracking.

In addition to being sent to the DSP 121 via the connection 5 for servo control, the devised RF signal is further sent to the demodulation unit 122 of the read access controller 120 for implementing the decoding of the EFM (Eight-to-Fourteen Modulation encoding) code. In the EFM demodulation unit 122, a digital signal is extracted from the RF signal, and demodulated in accordance with the stipulations of the IEC (International Electrotechnical Commission) 908 standard. The result of this EFM demodulation are data signals arranged in bytes that can be sent to the CIRC (Cross-Interleave Reed-Solomon) decoder 123 for decoding of the Reed-Solomon code.

The CIRC decoder 123 also performs error detection and correction (EDC) as well as de-interleaving operations in accordance with the IEC 908 standard. In order to implement de-interleaving and also serve as a data buffer when receiving the input data, the CIRC decoder 123 must have a configuration incorporating a memory space sufficient for data manipulation during the process of operation. This memory space is normally a 2 K-byte SRAM 124 as included in the drawing.

After error detection and de-interleaving processing, data can be converted into serial form in the serial output unit 125, and then sent to the next processing circuit, namely the signal decoder 130 via the connection 26.

The signal decoder 130 proceeds with its error detection and correction operations utilizing the internal RSPC (Reed-Solomon product-like code) decoder 132 in accordance with the stipulations of the ISO/IEC 10149 standard. This is done by the RSPC decoder 132 performing an operation on the serial data received by the signal decoder 130 over connection 26. Then, the EDC generation unit 134 of the signal decoder 130 performs data error detection in terms of data blocks. If any error is detected, the correction procedure can be invoked to correct. After being processed by the EDC generation unit 134, data can then be relayed to the IDE or SCSI interface of the CD-ROM drive and then to the bus 150 under the control of the interface unit 133. Thus, data is then accessible by the host computer system over the bus 150.

In such conventional CD-ROM drives, one of the differences between the read access controller 120 and the signal processor 130 is that signal processor 130 needs to use cache memory for its operation. As the data access speed of CD-ROM drives are becoming ever faster a, data cache scheme in the data-decoding mathematical operations has become indispensable. However, cache hit rates in a caching memory is directly related to the size of the cache memory. In other words, too small a caching area is unable to achieve meaningful hit rates. As a result, since the 2 K-byte SRAM memory space is too small to be effective for providing useful caching space for the signal processor 130 to use, therefore, an additional external memory device such as a DRAM 140 is required. In this case, all units including EDC generation unit 134, RSPC unit 132 and interface controller unit 133 utilize the external DRAM 140 instead of their corresponding internal small SRAM as the working space, as the read access controller 120 has its own internal small SRAM 124.

In FIG. 1, both the internal SRAM 124 of read access controller 120 and the external DRAM 140 of the signal decoder 130 will experience substantially proportional increased frequency of access as the CD-ROM spindle speed is increased. Therefore, when designing the control electronics of a CD-ROM drive, the allowed highest access speed of both the SRAM 124 and the DRAM 140 must also be increased as the CD-ROM drive spindle speed is improved.

The following analysis calculates the frequency of access into the corresponding SRAM 124 and DRAM 140 by the read access controller 120 and the signal decoder 130 respectively as the CD-ROM drive is reading data from the disc surface. For convenience, the calculations are based on the access to one data block (2,048 bytes) by the CD-ROM drive when the drive controller electronics must perform access to both the SRAM 124 and the DRAM 140. The access frequency of the controller electronics to the memories 124 and 140 are calculated as a basis of statistics and comparison.

Here it should be noted that the calculations are based on the scope of CD-ROM of the ISO 9660 standard. All the calculations are based on the worst-case considerations of read/write accesses in the memory devices when reading errors of RS codes under the 9660 standard may arise and error correction procedures must be performed. However, as may be appreciated, it is absolutely abnormal to detect error in every access to the CD-ROM disc under normal conditions. Nonetheless, as persons skilled in the art should all agree, design of the controller electronics for a CD-ROM drive must consider the worst-case conditions within the design specification.

Based on the above assumptions and in accordance with the normal procedure, the access frequency to the internal SRAM 124 by the read access controller 120 is calculated to be 3,136 accesses per data block:

$$\text{Data input: } 98 \times 32 = 3{,}136.$$

Thus, for each data block (98 data frames of 32 bytes each), the EFM demodulator 122 sends out a total of 3,136 bytes of data to the CIRC decoder 123. CIRC decoder 123 then stores these data in SRAM 124 for performing the C1 word (referred to as C1 hereafter) de-interleaving and error detection on the CIRC-coded data.

$$C1: 98 \times (32 + 2 \times 2) = 3{,}528.$$

At the stage of the C1 word, data in each frame is processed in the following manner:

An RS code syndrome of the 32 bytes are first read, error contained therein detected and error value determined.

Errors are then corrected. Normally C1 is capable of correcting two errors, with each error value read out and the correct one written back. Therefore, the processing of every error correction involves one read and one write access of data, a total of two accesses in the memory. Since there are at most two errors allowed, therefore, a maximum total of times of read/write access is 2×2=4 (involving both read and write).

From the above, it is clear that the maximum number of read/write accesses to each of the data frames is 36 (32+2×2), while there are a total of 98 frames, therefore, a total of 3,528 SRAM accesses are maximum at the C1 stage. Then, at the C2 (C2 word stage, referred to as C2 hereafter) stage:

$$C2: 98 \times (28 + 2 \times 4) = 3{,}528.$$

In comparison to the (32, 28) RS code at the C1 stage, the RS code at the C2 stage is a (28, 24) RS code, with a 28-byte input data. Since C1 relays erasure bit to C2, therefore, C2 is capable of resolving four errors at most. Similarly to the case of C1, each error requires one read operation and one write operation to complete an error correction.

Thus, for C2, each data frame requires a maximum of 36 (28+2×4) accesses in the SRAM. And, for the 98 total data frames, a maximum of 3,528 (98×(28+2×4)) read/write accesses in the SRAM can be expected.

After the C1 and C2 stages of error correction processing, only 24 bytes of data in the 32 bytes in each data frame are required to be relayed to the decoder. As a result, a maximum total of 2,352 accesses in the 98 data frames are expected:

$$\text{Data output: } 98 \times 24 = 2{,}352.$$

To summarize, when a CD-ROM drive is accessing a data block on the data surface of a disc, a maximum of 12,544 accesses in the SRAM 124 as performed by the read access controller 120 can be expected:

98×32+98×(32+2×2)+98×(8+2×4)+98×24=12,544.

For the signal decoder 130, the access to its external DRAM 140, under conditions the same as those for the read access controller 120, can be analyzed as follows:

Data input: 2,340.

In accordance with the ISO/IEC 10149 standard, other than the synchronization patterns and headers, a total of 2,340 bytes out of the 2,352 bytes sent by the read access controller 120 are required to be input to the DRAM 140.

P subcode: 2×(43×26+2×1×43)=2,408.

The P subcode is obtained by organizing into two sets of RS codes each containing 43 groups (26, 24) based on the MSB (most significant bit) and the LSB (least significant bit) thereof. For each (26, 24) RS code, if one error were to be corrected, 2×1 read/write accesses would be required against the DRAM external to the signal decoder 130. Thus, there are a total of 2,408 read/write accesses:

2×43×(26+2×1)=2,408.

The first number 2 in the above expression indicates the fact that there are MSB and LSB, two sets of data. 43, on the other hand, stands for the fact that there are a total of 43 (26, 24) RS codes. 26 indicates that there are 26 data in each RS code, and 2×1 represents that both read and write accesses are required to perform error correction.

Q subcode: 2×26×(45+2×1)=2,444.

The Q subcode is also divided into two sets each containing 26 groups of (45, 43) RS codes based on the MSB and LSB thereof. In a similar manner, for each (45, 43) RS code to have an error corrected, two accesses of read and write must be performed in the DRAM. Therefore, similarly to the case of the P subcode, the total number of accesses in the DRAM is then 2,444:

2×26×(45+2×1)=2,444, and

EDC: 2,068.

In accordance with the ISO/IEC 10149 standard, an EDC is composed of 2,068 bytes, therefore, a total of 2,068 accesses to the DRAM are necessary.

Data output: 2,048.

When finally arriving at the bus, interface controller retrieves the 2,048 bytes of data from the DRAM and controls their output.

To summarize, signal decoder 130 has a maximum of 11,308 accesses in the external DRAM 140 when the CD-ROM drive is accessing one data block over the disc storage surface:

2,340+2×43×(26+2)+2×26×(45+2)+2,068+2,048=11,308.

Based on the above analysis calculations, if the read access controller 120 and the signal decoder 130 were to be merged and fabricated as a single IC device, and all the data accesses in the internal SRAM 124 are to be redirected to the external DRAM 140 instead, (in other words, if the internal SRAM 124 were to be discarded from the read access controller 120,) then the total number of memory accesses as the CD-ROM drive is reading one data block would be simply the sum of the accesses in both the SRAM 124 and the DRAM 140. A total of 23,582 access in the DRAM 140 would have to be performed if the SRAM 124 were removed:

12,544+11,308=23,852.

For DRAM 140, this increase is a virtual doubling of access frequency.

Therefore, if the read access controller 120 and the signal decoder 130 of a conventional CD-ROM drive control electronics were to be integrated into one single IC chip, and the original accesses toward the SRAM 124 internal to the read access controller 120 redirected to the DRAM 140 external to the signal decoder 130, a serious problem would arise. This problem would be caused by the fact that DRAMs are inherently much slower than SRAMs. If, in the case of the conventional CD-ROM drives, the SRAM 124 in the read access controller 120 is simply discarded and its accesses redirected to DRAM 140, the bandwidth of the memory access in the DRAM is never going to meet the need of a CD-ROM drives of ten or more times of the standard single-speed drive. In other words, high-speed DRAM must be used if the internal SRAM was to be discarded. Otherwise, data transfer bottleneck forms at DRAM. It is, however, well known that high-speed DRAMs are expensive.

SUMMARY OF THE INVENTION

It is therefore an object of the invention to provide a controller circuit apparatus combining the read access controller and the signal decoder of the conventional CD-ROM drives into one single IC device for the reduction of fabrication cost.

It is another object of the invention to provide a controller circuit apparatus requiring reduced frequency of access in an externally-connected DRAM device for improved overall performance characteristics based on proper design of data processing procedures.

To achieve the above-identified objects, the invention provides a controller circuit apparatus for a CD-ROM drive for digital data storage, capable of reading data stored on the CD-ROM disc for decoding and sending the data to a host computer system via a bus interface. The apparatus includes a digital signal processor (DSP) that controls the CD-ROM disc spindle motor and the laser pick-up head for reading data stored over the surface of the CD-ROM disc, and receives signals representing the read data transmitted by an RF amplifier. An EFM code demodulator receives the data output of the RF amplifier for implementing the EFM demodulation to obtain the EFM code. A CIRC code processor receives the output of the EFM demodulator for implementing the decoding of the CIRC code. A Reed-Solomon code decode engine can be used for RS decoding. An RSPC/EDC processor receives the output of the CIRC processor and the Reed-Solomon code decode engine for performing error detection and correction, while the Reed-Solomon code decode engine receives the output of the CIRC processor and the RSPC/EDC processor for implementing the decoding of the Reed-Solomon code. A bus interface controller relays the final decoded digital signal obtained in the controller circuit apparatus of the CD-ROM drive over to the bus interface for transmission to the host computer system. CIRC processor and RSPC/EDC processor, together with the bus interface controller, are combined directly with a working memory device of the CD-ROM drive, allowing for separate and independent access directly in the memory space of the working memory device.

BRIEF DESCRIPTION OF THE DRAWINGS

Other objects, features, and advantages of the invention will become apparent by way of the following detailed description of the preferred but non-limiting embodiments. The description is made with reference to the accompanying drawings in which:

FIG. 3 schematically shows the P and Q subcodes of the CIRC encoding;

DETAILED DESCRIPTION OF THE PREFERRED EMBODIMENTS

Figure 1:
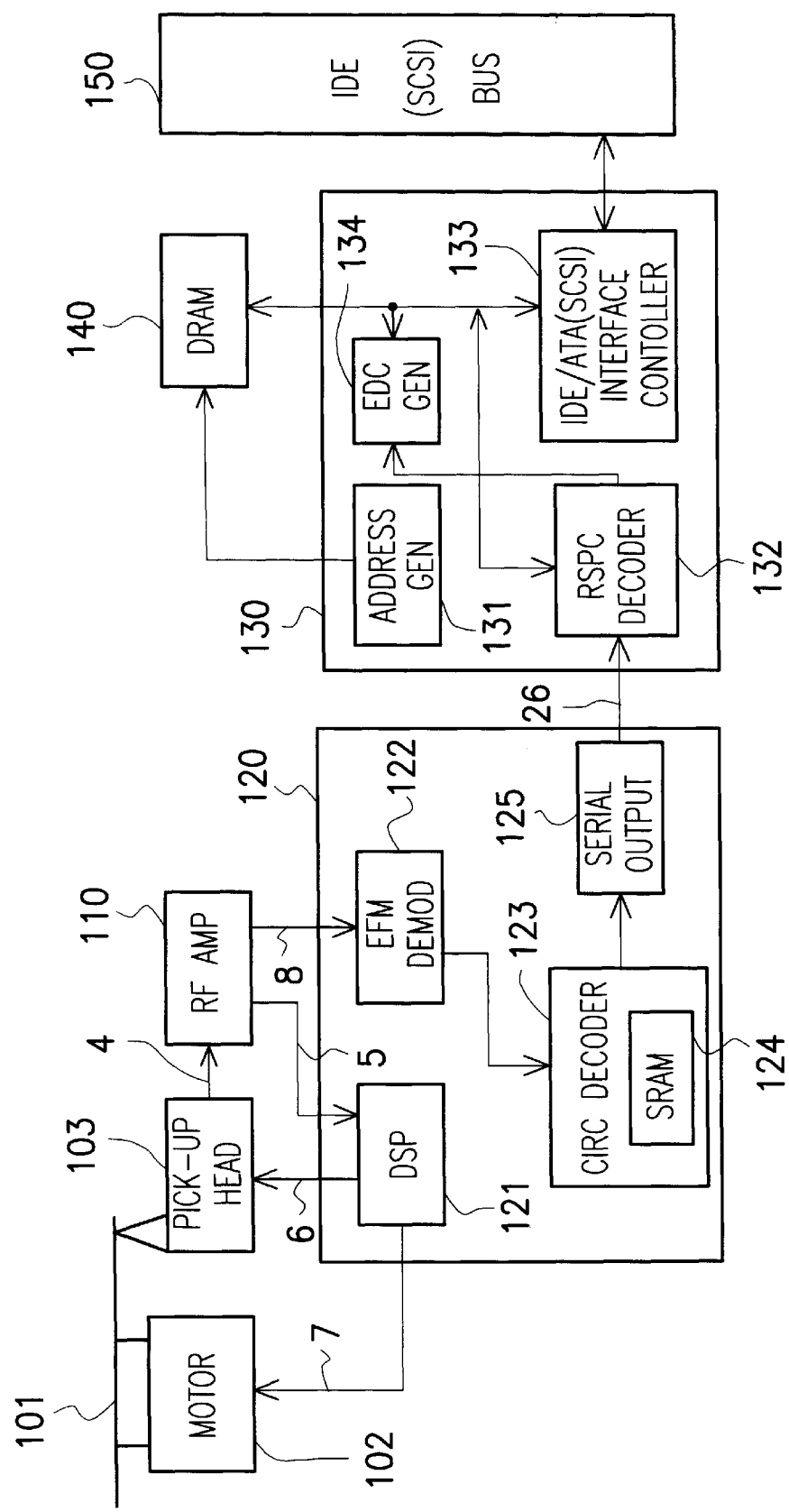
FIG. 1 is a block diagram showing the circuit configuration of the main controller electronics of the conventional CD-ROM drive wherein the two major functional units, the read access controller and the signal decoder, are implemented in separate and independent IC chips.
Figure 4:
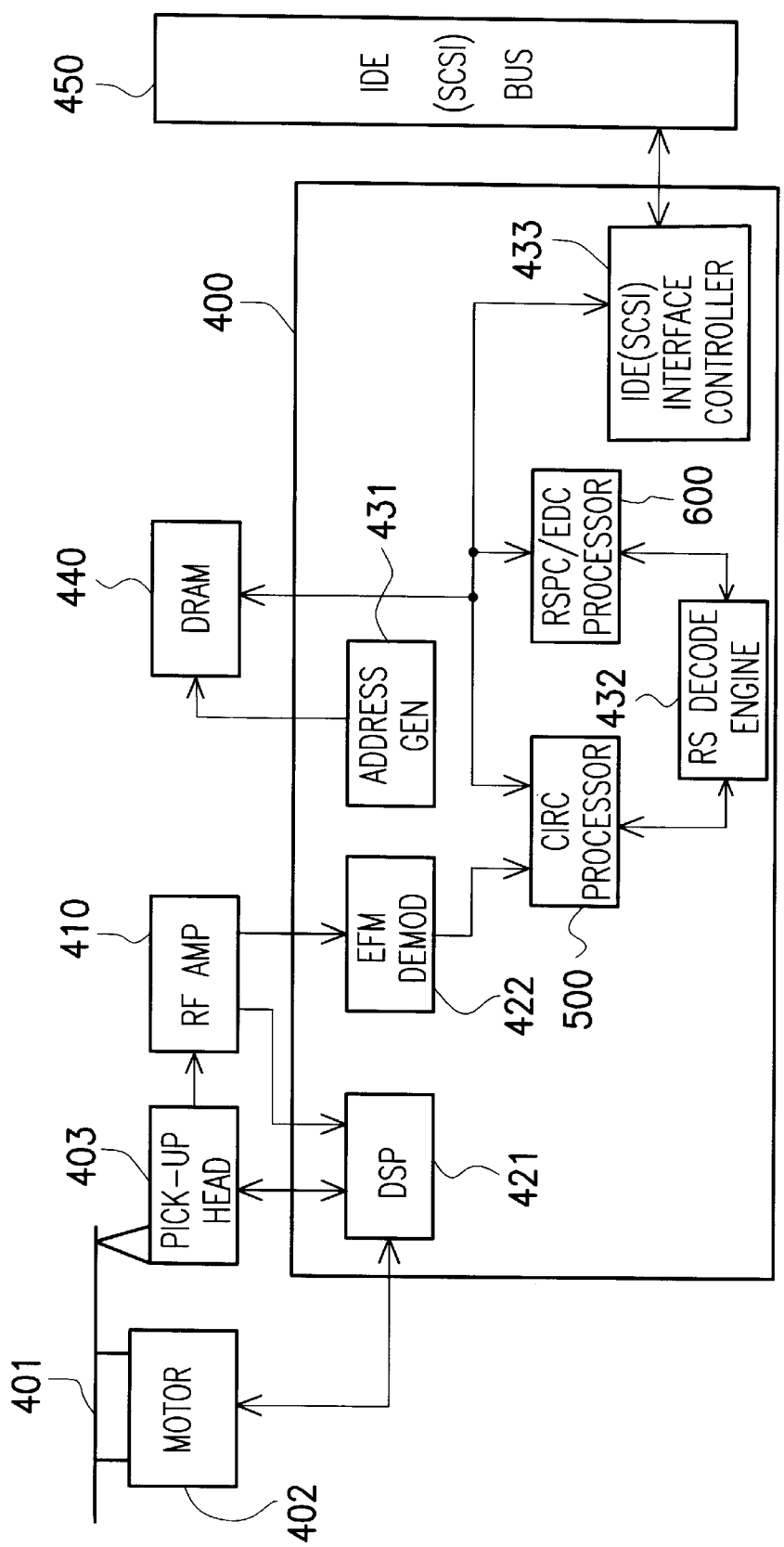
FIG. 4 is a block diagram showing the circuit configuration of the main controller electronics of the CD-ROM drive constructed in accordance with a preferred embodiment of the invention wherein the major functional units are implemented as a single IC chip.

As is illustrated in FIG. 4, the read access controller 120 and the signal decoder 130 implemented into two separate IC devices as exemplified in the prior art CD-ROM drive of FIG. 1 can be integrated as a single IC device. In the integrated controller electronics outlined as circuitry 400 for a CD-ROM drive, each of the DSP 421, the EFM 422, the interface unit 433, and the DRAM address generator 431 assumes substantially the same or similar functionality as their respective corresponding counterpart in the electronics of the conventional CD-ROM drive of FIG. 1.

As is illustrate in the drawing, CIRC processor 500 differs from the CIRC decoder unit 123 of the controller electronics of the conventional CD-ROM drive by essentially the fact that the internal SRAM 124 in the prior-art drive is removed. In this described embodiment, CIRC processor 500 shares the same memory, namely DRAM 440, that other functional units in the signal decoder 130 (FIG. 1) access for operation. In this case, the decoder unit 123 in the prior-art read access controller 120 can be discarded.

Similarly to the case of the conventional CD-ROM drives shown in FIG. 1, the embodiment of FIG. 4 has distinguishing characteristics. In the described embodiment of the invention, the CD-ROM drive has its originally separated CIRC decoder unit 123 and RSPC decoder 132 incorporated in the read access controller 120 and the signal decoder 130 respectively, and they share the same RS decoder engine 432. Since CIRC and RSPC codes are basically RS codes, therefore, the sharing of the same RS decoder engine can simplify the controller electronics.

As mentioned previously, if the read access controller 120 and the signal decoder 130 of the prior art CD-ROM drives were simply integrated together and implemented as a single IC chip without proper design adjustments and improvements, then the external DRAM 440 used in the circuit configuration of FIG. 4 would be require to be capable of very high access speed in order to avoid the formation of a bottleneck in data flow as mentioned above. Specifically, for the contemporary ten- or more speed (10×) CD-ROM drives, the DRAM 440 used must be operating at a more than 100 percent faster access speed to properly cope with the need. The DRAM 400 generally serves as a working memory device that is a memory device physically external to the circuitry 400 and is used as the memory storage space of the implementation of the decoding and error detection and correction of the processed data.

By contrast, in a preferred embodiment of the invention, the circuit of FIG. 4 may employ an innovative configuration of both the CIRC processor 500 and the RSPC/EDC processor 600 thereof to achieve a reduction in access frequency in the external DRAM. The reduction in access frequency to the DRAM memory device may be to a level reasonable for high spindle-speed CD-ROM drives. With the innovative configuration of the invention, DRAM devices of normal access speeds can be used for this purpose. The following paragraphs show how this can be achieved.

Figure 5:
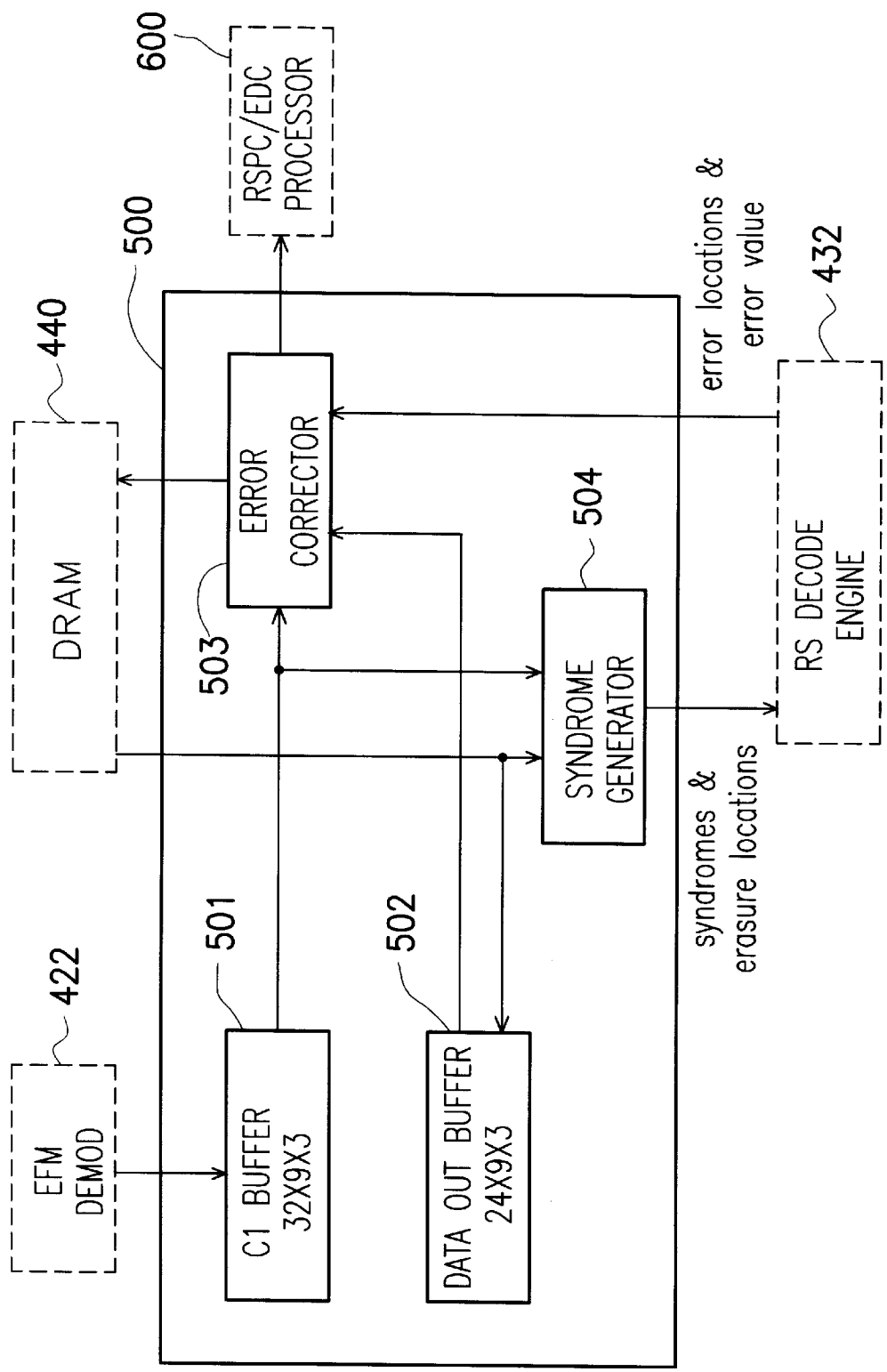
FIG. 5 shows the circuit configuration of the CIRC processor of the main controller electronics of the CD-ROM drive constructed in accordance with the preferred embodiment of the invention.

FIG. 5 shows the circuit configuration of the CIRC processor 500 of the main controller electronics of the CD-ROM drive as constructed in accordance with the preferred embodiment of the invention. As is illustrated, data is sent bit-by-bit into the CIRC processor 500 by the EFM demodulator unit 422. The received data is first stored in a C1 buffer 501 having the configuration of 32×9×3 bits. This buffer 501 is provided for use in the process of C1 de-interleaving. When the serial-input data is accumulated in the C1 buffer 501 and forms a complete C1 data frame, the 32 bytes of data in the C1 data frame may then be relayed to the syndrome generator 504.

Then, the syndrome generator 504 generates four syndrome values S1, S2, S3 and S4 based on the obtained data. After receiving these four syndrome values, and acknowledging the position of the erasure bit of this particular data frame, the RS decode engine is able to find the location and value of the error involved. This information is then relayed to the error corrector 503 of the CIRC processor 500. Based on data relayed by the RS decode engine 432, the error corrector 503 corrects the erroneous data is in C1 buffer 501, and the corrected data then stored in DRAM 440 for later C2 de-interleaving and RS decoding.

Since the depth of C2 interleaving is deeply down to 108 layers, which represents quite a large amount of data, buffers are therefore not suitable for processing. As a result, after the resolution of C1 and before C2, data must still be held in DRAM 440. On the other hand, however, after the resolution of the C2, but before the data is output, output buffer 502 may still be used to hold data temporarily since there are only two interleaving layers. This avoids the need for read/write accesses to the DRAM.

When data is undergoing the C2 stage of RS decoding, the processing up to the stage when the data is sent to the RSPC/EDC processor 600 can be described as follows. First of all, C2 data is retrieved from the external DRAM 440. Meanwhile, each data is also stored in the output buffer 502 serving as a temporary storage. At the same time, data are also sent to the syndrome generator 504 for the generation of the syndrome value, as well as recording of the erasure location, so as to allow for the RS decode engine 432 to proceed with its decoding operation of the (28, 24) RS code. Locations with errors arising, and the values of the errors are sent back to the error corrector 503. Thus, each data sent to the RSPC/EDC processor 600 need not be retrieved from the DRAM, rather, uncorrected data can be read out directly from the data output buffer 502 for correction in the error corrector 503 and then the corrected data sent to the RPSC/EDC processor 600 for further processing.

Figure 2:
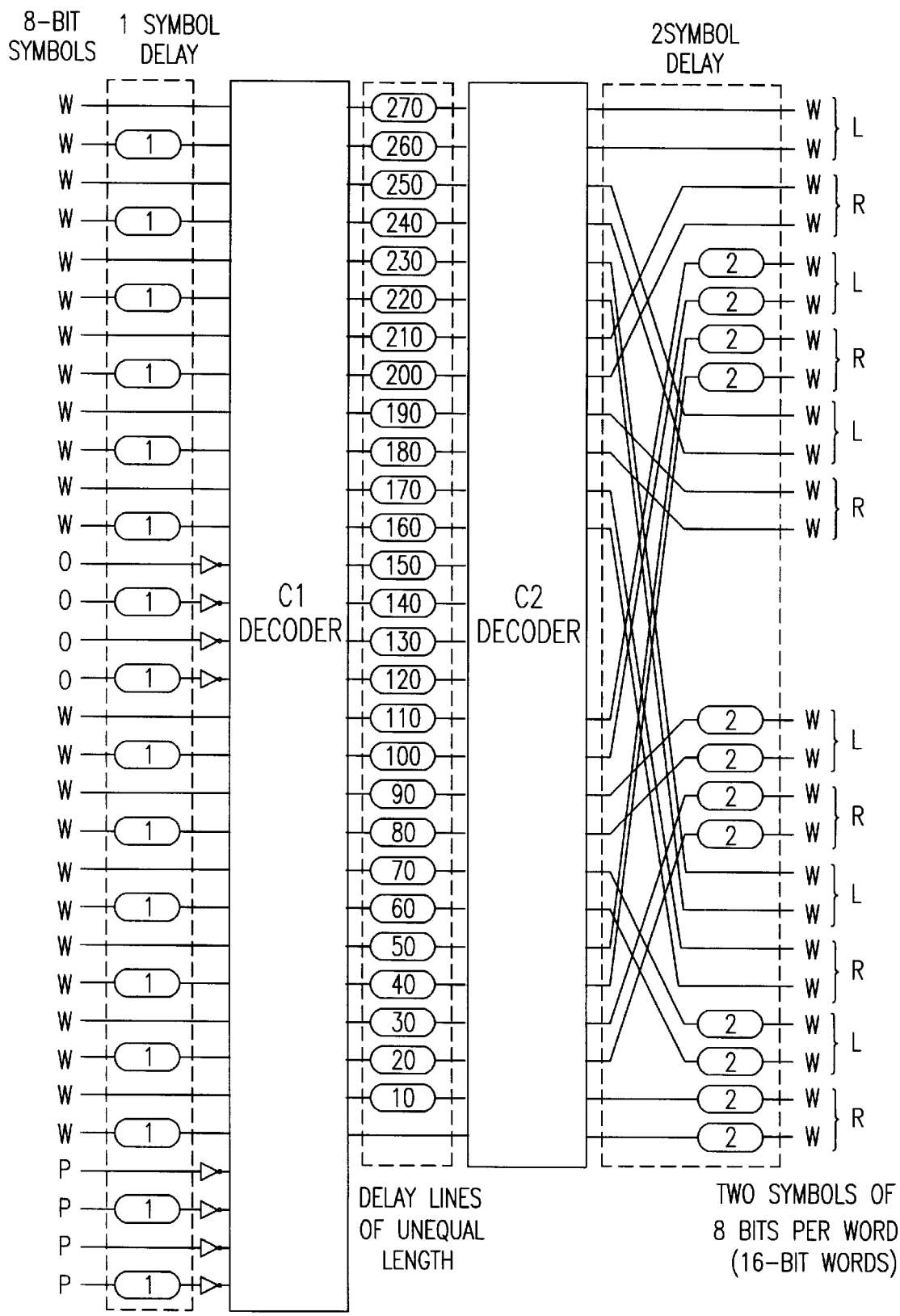
FIG. 2 schematically shows the CIRC decoding algorithm.

Sizes of the storage spaces of the C1 buffer 501 and the data output buffer 502 can be determined based on the CIRC definition as outlined in the IEC 908 standard depicted in FIG. 2. FIG. 2 schematically outlines the process flow of the CIRC decoding algorithm. As can be observed, in the process of the CIRC decoding algorithm, there is one layer of interleaving between data input and C1 decoding; therefore, two data frames are required. In other words, one complete set of data to be provided to the C1 decoder can only be obtained once every other entire data frame. If there is an additional frame of data added for buffering of the input data for the EFM demodulator 422, there will be a total of three frames of data, which is a total of 32×9×3=864 bytes (or 32×8×3=768 bytes if erasure bit is excluded).

Similarly to the case of the C1 buffer, there are two interleaving layers between C2 decoding and the output of data according to the IEC 908 standard as outlined in FIG. 2. In other words, there are every two other data frames before one complete frame of data can be obtained for processing in the RSPC/EDC processor 600. However, since C2 decoder data is controllable, it is unlike in the case of the C1 buffer that requires the addition of an extra frame of data for buffering. On the other hand, only the 24 bytes of data to be output is required to be stored in the data output buffer (input data to the C2 decoder are 28 bytes), therefore, the require size of the data output buffer can be determined to be 24×9×3=648 bytes.

As a result, the total number of accesses to the external DRAM 440 by the CIRC processor 500 (calculated on the basis of 98 data frames) can be determined by:

1. Solving C1 and writing the resolved result into DRAM: 98 frames×28 bytes/frame=2,744 bytes.
2. Retrieving data from DRAM and implementing C2 decoding: 98 frames×28 bytes/frame=2,744 bytes.

Thus, the total number of accesses is 5,488:

2,744+2,744=5,488.

Figure 6:
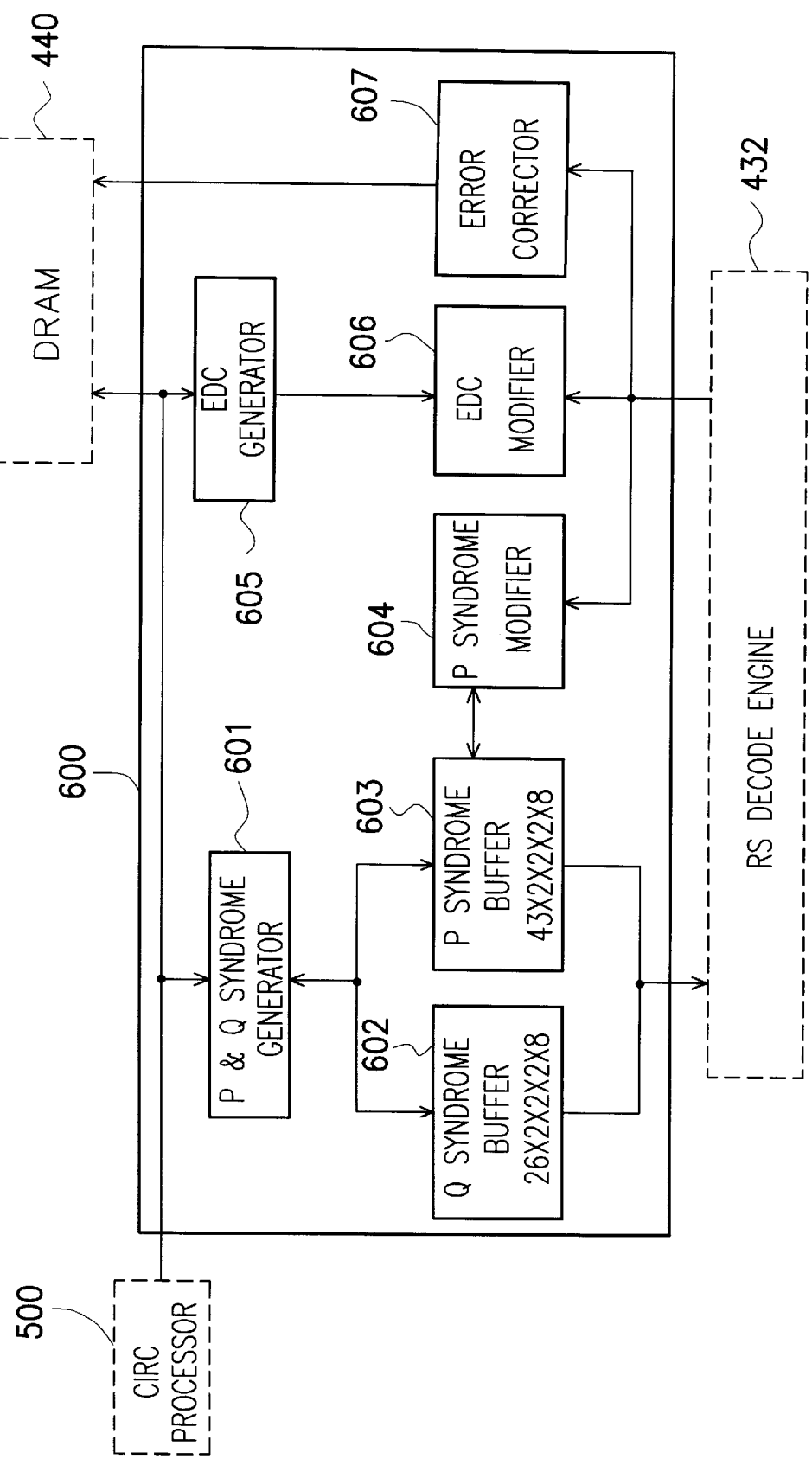
FIG. 6 shows the circuit configuration of the RSPC/EDC processor of the main controller electronics of the CD-ROM drive constructed in accordance with the preferred embodiment of the invention.

FIG. 6 shows the circuit configuration of the RSPC/EDC processor of the main controller electronics of the CD-ROM drive constructed in accordance with the preferred embodiment of the invention. As is illustrated, each of the data sent by the CIRC processor 500, in the RSPC/EDC processor 600 of FIG. 6, will be sent to two other electronic functional units, namely the P & Q syndrome generator 601 and the EDC generator 605, as well as the external DRAM 440 simultaneously.

In the P & Q syndrome generator 601, the P and Q syndrome values generated are stored in the P syndrome buffer 603 and the Q syndrome buffer 602 respectively. The stored syndrome values can be used to update the data held in these two buffers. Note that the P syndrome buffer 603 is a 43×2×2×2×8-byte buffer, while the Q syndrome buffer 602 is a 26×2×2×2×8-byte one. On the other hand, in the EDC generator 605, a corresponding error detection code can be generated in accordance with the ISO/IEC 10149 standard. From the perspective of these two functional units, the function of the external DRAM 440 is to provide the memory storage space for data that allows for the implementation of the data correction operation. Other than this, this DRAM storage space in the controller electronics of the typical CD-ROM drives can be used to provide the caching space as well, in order to improve the overall data processing performance characteristics.

Next, the Q syndrome buffer 602 can relay the Q syndrome data organized as 26×2 to the RS decode engine 432, so that the RS decoding may proceed. The decoded result can be relayed to the P syndrome modifier 604 for the modification of the P syndrome. The decoded result can also be sent to the EDC modifier 606, so that EDC can be modified. The decoded result can further be sent to the error corrector 607, where the data stored in the DRAM 440 can be modified.

After the Q syndrome value is resolved and the P syndrome buffer 603 has its stored content upgraded, the P syndrome buffer 603 transmits the P syndrome organized as 43×2 to the RS decode engine 432, where the RS code is decoded. The result of this decoding is then relayed to the EDC modifier 606, so that EDC can be modified. The decoded result can further be sent to the error corrector 607, where the data stored in the DRAM 440 can be modified.

The sizes of the storage space in the Q syndrome buffer 602 and the P syndrome buffer 603 can be determined based primarily on the data storage spaces that are required for the storage of two blocks of Q and P syndrome values. In other words, when one block of data is undergoing a decoding operation, the buffering space is still sufficient for inputting and holding another entire block of data. This is a means to maintain the continuous flow of data in the process pipeline. FIG. 3 schematically shows the construction of the P and Q subcodes of the CIRC encoding. According to FIG. 3, the Q syndrome value has 26 sets of (45, 43) RS codes for both MSB and LSB, while each RS code includes two syndrome values, therefore the memory space for Q syndrome buffer 602 has a memory size of 1,664 bytes:

26×2×2×2×8=1,664.

While, in one data block, P syndrome has 43 sets of (26, 24) RS code for both MSB and LSB, and each RS code has two syndrome values as in the case of Q syndrome, therefore the memory space for the P syndrome buffer 603 has a memory size of 2,752 bytes:

43×2×2×2×8=2,752.

If P and Q syndromes were to be extracted directly from the data sent by the CIRC processor 500, or the P syndrome were to be updated directly from the error location and error value obtained from the Q syndrome, then the relationship between the P and Q locations in each input data must be obtained in the first place.

With reference to FIG. 3, let n represent the n-th data in the drawing, where n is an integer number. Let data of ($N_P$, $M_P$) represent the $M_P$-th data in the $N_P$-th set of the RS of P. In a similar manner, let ($N_Q$, $M_Q$) represent the $M_Q$-th data in the $N_Q$-th set of RS of Q. Thus, the relationship between n, ($N_P$, $M_P$) and ($N_Q$, $M_Q$) is:

if $n \leq 1,117$ then $$\begin{cases} N_P = n \bmod 43 \\ M_P = \left\lfloor \dfrac{n}{43} \right\rfloor \end{cases} \quad (1)$$

$$\begin{cases} M_Q = N_P \\ N_Q = (M_P - M_Q) \bmod 26 \end{cases} \quad (2)$$

if n>1,117 then $$\begin{cases} M_Q = \left\lfloor \dfrac{n-1,118}{26} \right\rfloor + 43 \\ N_Q = (n-1,118) \bmod 26 \end{cases} \quad (3)$$

Thus, based on expressions (1) and (2), the corresponding $(N_P, M_P)$ and $(N_Q, M_Q)$ for n<1,117 can be determined. Further, based on expression (3), $(N_Q, M_Q)$ can also be determined for n>1,117.

For the RS code of P, the syndrome is:

$$\begin{cases} S_{1,N_P} = \sum_{i=0}^{25} R_{(N_P,i)} \\ S_{2,N_P} = \sum_{i=0}^{25} R_{(N_P,i)} \cdot \alpha^{(25-i)} \end{cases} \quad (4)$$

wherein $R(N_P, i)$ is the corresponding data for $(N_P, i)$.

For the RS code of Q, the syndrome is:

$$\begin{cases} S_{1,N_Q} = \sum_{i=0}^{44} R_{(N_Q,i)} \\ S_{2,N_Q} = \sum_{i=0}^{44} R_{(N_Q,i)} \cdot \alpha^{(44-i)} \end{cases} \quad (5)$$

Based on expressions (4) and (5), P and Q syndromes may be updated immediately when each data is sent by the CIRC processor 500 into the RSPC/EDC processor 600.

When one set of RS code of Q is solved, expression (2) may then be employed to obtain the $(N_P, M_P)$ corresponding to each error detected, and allowing P syndrome modifier 604 to be used to update the corresponding syndrome held in the P syndrome buffer 603.

For example, if error E arises in $(N_{PE}, M_{PE})$, then expression (4) can be used to update the P syndrome as follows:

$$S_{1,N_{PE}} \leftarrow S_{1,N_{PE}} + E$$

$$S_{2,N_{PE}} \leftarrow S_{2,N_{PE}} + E \cdot \alpha^{(25-M_{PE})}$$

The operating principle of EDC modifier 606 is similar to that of the P syndrome modifier. Namely, as P or Q resolves one error, expressions (1) and (2) can be used to obtain N, which may be added by either MSB or LSB, whichever is being processed, in order to map into the location of the EDC, so that the EDC value can be corrected accordingly.

When the main controller electronics for CD-ROM drive employing the combined and single-unit DRAM configuration of the invention as depicted in FIGS. 4, 5 and 6 is operated, for the single-functional unit RSPC/EDC processor 600, the read/write accesses in its external DRAM 440 can be categorized into three types:

The first type of memory access concerns the writing of the data of CIRC processor 500 into the external DRAM 440. This category of operation only requires the writing of the 2,048 bytes of data to be relayed to the IDE/ATA/SCSI bus of the CD-ROM drive into the DRAM 440.

The second type of memory access concerns the correction of the RS code error data for the P subcode. Since each (26, 24) RS code is capable of correcting one error, while the implementation of the correction of one erroneous data requires to conduct the reading operation as well as the writing of corrected data, therefore, two accesses to the external DRAM are necessary. In the standard for CD-ROM drive, there are a total of 2×43 sets of RS codes for the P subcode, there will therefore be a total of 172 accesses in the memory for the processing of an entire block of data:

2×43×2=172.

The third type of memory access concerns the correction of the RS code error data for the Q subcode. Since each Q is a (45, 43) RS code that is capable of correcting one error, while the implementation of the correction of one erroneous data requires to conduct the reading operation as well as the writing of corrected data, therefore two accesses to the external DRAM are necessary. Due to the fact that each block of data contains a total of 2×26 sets of RS code for Q subcode, therefore the total number of accesses in the memory is 104:

2×26×2=104.

Thus, when an entire data block is considered, the summation of the above-described three types of memory access operations is the total number of accesses that must be conducted in the external DRAM of the RSPC/EDC processor. This summation amounts to 2,324 accesses:

2,048+104+172=2,324.

For a complete data block, the interface controller 433 reads 2,048 bytes of data onto the IDE/ATA/SCSI bus of the CD-ROM drive.

Thus, in the depicted embodiment of FIG. 4, the CIRC processor 500 performs a total of 5,488 accesses in its externally-connected DRAM 440. On the other hand, accesses performed by the RSPC/EDC processor 600 toward the DRAM are summed up to 2,324. Meanwhile, the interface controller 433 also performs 2,048 accesses in the DRAM. As a result, a total of 9,860 accesses must be performed in the DRAM for the controller electronics of CD-ROM drive employing the configuration of the invention:

5,488+2,324+2,048=9,860.

Upon comparison, this total access frequency of the controller electronics of the invention is much less than that required by the prior-art counterpart. This improves overall system performance characteristics considerably. Meanwhile, the SRAM memory internal to the CIRC decoder as found in the prior art can be removed, therefore, the cost for fabricating the IC device can also be reduced.

Thus, the above descriptive paragraphs are intended to cover various modifications and similar arrangements included within the spirit and scope of the appended claims, and the scope of which should be accorded the broadest interpretation so as to encompass all such modifications and similar structures.

What is claimed is:

1. A controller circuit apparatus for a CD-ROM drive for digital data storage, capable of reading data stored on a CD-ROM disc for decoding and sending to a host computer system via a bus interface, the apparatus comprising:

a digital signal processor (DSP), controlling a CD-ROM disc spindle motor and a laser pick-up head for reading data stored on the CD-ROM disc, and receiving a signal representing a read data output by a radio frequency (RF) amplifier;

an eight-to-fourteen (EFM) code demodulator, receiving the data output of the RF amplifier for implementing the EFM demodulation to obtain an EFM code;

a cross-interleaving Reed-Solomon (CIRC) code processor, receiving an output of the EFM demodulator for implementing decoding of a CIRC code;

a Reed-Solomon (RS) code decode engine;

a Reed-Solomon product code/error detection and correction (RSPC/EDC) processor, receiving an output of the CIRC processor and the Reed-Solomon code decode engine for performing error detection and correction, the Reed-Solomon code decode engine receiving the output of the CIRC processor and an output of the RSPC/EDC processor for implementing the decoding of a Reed-Solomon code and also exporting its output to the CIRC code processor; and a bus interface controller, relaying a final decoded digital signal obtained in the controller circuit apparatus of the CD-ROM drive over to the bus interface for transmission to the host computer system;

wherein a working memory device of the CD-ROM drive is accessible at any one time to only one of the CIRC processor, the RSPC/EDC processor, and the bus interface controller.

2. The controller circuit apparatus of claim 1, wherein the working memory device is one single memory device that is used as a memory storage space for performing decoding and error detection and correction of the data.

3. The controller circuit apparatus of claim 1, wherein the working memory device is a memory device physically external to the apparatus used as the memory storage space of the implementation of the decoding and error detection and correction of the processed data.

4. The controller circuit apparatus of claim 3, wherein the working memory device is a DRAM.

5. The controller circuit apparatus of claim 4, wherein the controller circuit apparatus is fabricated in a single integrated circuit device.

6. The controller circuit apparatus of claim 5, wherein the CD-ROM drive reads CD-ROM discs of the ISO 9660 format.

7. The controller circuit apparatus of claim 6, wherein the CD-ROM drive has an IDE bus interface.

8. The controller circuit apparatus of claim 6, wherein the CD-ROM drive has a SCSI bus interface.

9. The controller circuit apparatus of claim 1, wherein controller circuit apparatus is fabricated in a single integrated circuit device.

10. The controller circuit apparatus of claim 1, wherein the CD-ROM drive reads CD-ROM discs of the ISO 9660 format.

11. The controller circuit apparatus of claim 1, wherein the CD-ROM drive has an IDE bus interface.

12. The controller circuit apparatus of claim 1, wherein the CD-ROM drive has a SCSI bus interface.

13. The controller circuit apparatus of claim 1, wherein the CIRC processor further comprises:

a C1 buffer, used to receive the output of the EFM demodulator;

an error corrector, used to at least receive an output of the C1 buffer and the output of the RS code engine, and used to export an output to the working memory device and an output to the RSPC/EDC processor;

a data-out buffer, used to receive an output of the working memory device and export an output to the error corrector; and a syndrome generator, used to receive the output of the working memory device and the output of the C1 buffer, and export an output, serving as the output of the CIRC processor, to the RS decode engine, wherein when a first (C1) processing is performed, the C1 buffer, the error corrector and the syndrome are used for the first (C1) process, and when a second (C2) processing step is performed, the data out buffer temporarily stores the output of the working memory device so that as the error corrector is sending its output to the RSPC/EDC processor, the error corrector directly fetches contents of the output of the working memory device without accessing the working memory device.

14. A controller circuit apparatus for a CD-ROM drive for digital data storage, capable of reading data stored on the CD-ROM disc of the ISO 9660 format for decoding and sending to a host computer system via a bus interface, the apparatus comprising:

a cross-interleaving Reed-Solomon (CIRC) code processor, a Reed-Solomon code decode engine, a Reed-Solomon product code/error detection and correction (RSPC/EDC) processor, and a bus interface controller, wherein the CIRC processor, the RSPC/EDC processor, and the bus interface controller are each capable of accessing a memory space of a working memory device, and the Reed-Solomon code decode engine is coupled to the CIRC code processor and the RSPC/EDC processor for performing decoding and data communication.

15. The controller circuit apparatus of claim 14, wherein the working memory device is one single memory device that is used as a memory storage space for performing decoding and error detection and correction of the data.

16. The controller circuit apparatus of claim 14, wherein the working memory device is a memory device physically external to the apparatus used as the memory storage space of the implementation of the decoding and error detection and correction of the processed data.

17. The controller circuit apparatus of claim 16, wherein the working memory device is a DRAM.

18. The controller circuit apparatus of claim 17, wherein the controller circuit apparatus is fabricated as a single integrated circuit device.

19. The controller circuit apparatus of claim 14, wherein the controller circuit apparatus is fabricated in a single integrated circuit device.

20. The controller circuit apparatus of claim 14, wherein the CD-ROM drive has an IDE bus interface.

21. The controller circuit apparatus of claim 14, wherein the CD-ROM drive has a SCSI bus interface.

22. The controller circuit apparatus of claim 14, wherein the CIRC processor further comprises:

a C1 buffer, used to receive an output of the EFM demodulator;

an error corrector, used to at least receive an output of the C1 buffer and an output of the RS code engine, and used to export an output to the working memory device and an output to the RSP/EDC processor;

a data-out buffer, used to receive an output of the working memory device and export an output to the error corrector; and a syndrome generator, used to receive the output of the working memory device and the output of the C1 buffer, and export an output, serving as the output of the CIRC processor, to the RS decode engine, wherein when a first (C1) processing is performed, the C1 buffer, the error corrector and the syndrome are used for the first (C1) process, and when a second (C2) processing is performed, the data out buffer temporarily stores the output of the working memory device so that as the error corrector is sending its output to the RSPC/EDC processor, the error corrector directly fetches contents of the output of the working memory device without accessing the working memory device.

* * * * *